United States Patent
Kato et al.

(10) Patent No.: US 6,711,228 B1
(45) Date of Patent: Mar. 23, 2004

(54) MULTI-RATE CLOCK GENERATOR AND MULTI-RATE DIGITAL DATA REPRODUCING DEVICE

(75) Inventors: Yoshikazu Kato, Katano (JP); Haruo Ohta, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/600,138
(22) PCT Filed: Nov. 4, 1999
(86) PCT No.: PCT/JP99/06149
§ 371 (c)(1), (2), (4) Date: Jul. 12, 2000
(87) PCT Pub. No.: WO00/30107
PCT Pub. Date: May 25, 2000

(30) Foreign Application Priority Data

Nov. 13, 1998 (JP) ............................................. 10-323109

(51) Int. Cl.$^7$ ................................................ H03D 3/24
(52) U.S. Cl. ...................... 375/376; 375/375; 327/159
(58) Field of Search ................................. 375/375, 376; 327/147, 150, 151, 156, 159, 160; 713/400, 500, 501, 600, 601; 360/32, 43, 51

(56) References Cited

U.S. PATENT DOCUMENTS

| | | | | |
|---|---|---|---|---|
| 5,406,427 A | * | 4/1995 | Shimoda ........................ | 360/51 |
| 5,663,945 A | * | 9/1997 | Hayashi et al. .......... | 369/47.35 |
| 5,802,123 A | * | 9/1998 | Yoshimura et al. .......... | 375/376 |
| 5,838,749 A | * | 11/1998 | Casper et al. ................ | 375/376 |
| 5,870,591 A | * | 2/1999 | Sawada ........................ | 713/500 |
| 5,963,608 A | * | 10/1999 | Casper et al. ................ | 375/373 |
| 6,100,724 A | * | 8/2000 | Yoshimura et al. .......... | 327/100 |

FOREIGN PATENT DOCUMENTS

JP 9135240 5/1997

* cited by examiner

*Primary Examiner*—Phoung Phu
(74) *Attorney, Agent, or Firm*—Stevens, Davis, Miller & Mosher, LLP

(57) ABSTRACT

In order to construct a PLL circuit corresponding to the plurality of reproduction channel rates by using only a digital loop filter, the generation of a clock in accordance with the reproduction signal, of which the reproduction channel rate varies, is implemented with only one voltage control oscillator 7 in the case when the channel rate of the reproduction signal reproduced from the reproducer 1 varies at n/m of the basic channel rate at the time of recording by allowing the divider 6 to convert the output of the voltage control oscillator 7, which oscillates at the basic channel rate, into a reproduction clock through the n/m division. The control signal for controlling the voltage control oscillator 7 is generated through the phase error detector 3 and the digital loop filter 4, and by constructing this digital loop filter 4 with a digital filter which processes using the reproduction clock gained through the n/m division, a PLL circuit with an equal loop delay and loop sensitivity for any data rate can be implemented where, even in the case that the reproduction channel rate varies at a ratio of n/m, the frequency characteristics vary in a similar manner accordingly.

4 Claims, 9 Drawing Sheets

MULTI-RATE CLOCK GENERATOR AND MULTI-RATE DIGITAL DATA REPRODUCING DEVICE

TECHNICAL FIELD

The present invention relates to a multi-rate clock generator for generating clocks in accordance with a plurality of channel data rates from reproduction data gained by A/D conversion of reproduction signals and a multi-rate digital data reproducing device for reproducing recorded digital signals at a plurality of channel rates.

BACKGROUND TECHNOLOGY

In recent years a system of reproduction by varying the number of reproduction channels and cylinder revolutions has been used quite often for the reproduction of recording tapes with different formats in a reproduction unit for digitally recorded magnetic tape.

For example, as a tape format for broadcasting tasks which digitally record video signals, there are DVCPRO and DVCPRO50, which is the high picture quality versions of DVCPRO. Those formats have exactly the same recording wave length on the tape, track pitch, track angle on the tape and number of cylinder revolutions. Total recording data rate per unit hour, however, is twice as high in DVCPRO50 as in DVCPRO.

Therefore, recording and reproducing are carried out with one channel (two heads) at 41.85 Mbps/ch in DVCPRO while recording and reproducing are carried out with two channels (four heads) at 41.715 Mbps/ch in DVCPRO50. Accordingly, data of one frame of picture signals are recorded as 10 tracks in DVCPRO while recorded as 20 tracks in DVCPRO50.

Since formats for recording tapes DVCPRO50 and recording tapes DVCPRO are different in general, video tape recorders corresponding to them, respectively, are necessary for reproducing both of them.

In addition, it is understood that since the tape format of DVCPRO50 is the same as that of DVCPRO in the track angle on the tape, the head is on track on the track of the tape of DVCPRO by cutting the tape speed in half and the revolutions in half in the video tape recorder of DVCPRO50.

Therefore, by cutting the number of cylinder revolutions and the tape speed of the video tape recorder of DVCPRO50 in half and by reproducing with two channels (four heads) at 20.8575 Mbps/ch, the DVCPRO tape can be reproduced in a convertible manner. At this time since the reproduction channel data rate is 20.8575 Mbps which is one half of 41.715 Mbps, DVCPRO50 needs a clock reproduction circuit and reproduction equalization circuit corresponding to the two channel rates.

In a prior art two types of clock reproduction circuits and reproduction equalization circuits are used by being switched in accordance with those two channel rates. An example of such a conventional magnetic tape reproduction unit is described in reference to the drawing in the following.

FIG. 9 shows a conventional multi-rate clock generator and multi-rate digital data reproducing device. In FIG. 9, a reproducer 1 reproduces the digitally recorded data at the first and the second channel rates.

The first rate reproduction equalizer 70 corrects the frequency characteristics of the reproduction signals reproduced at the first channel rate into desired frequency characteristics. The first rate signal discriminator 71 discriminates the output of the first rate reproduction equalizer 70 at the first sample rate so as to be decoded into the original digital data. The first rate voltage control oscillator 74 generates the clock of the basic frequency at the first channel rate, of which the frequency is variable due to the voltage. The first rate phase error detector 72 detects the phase shift between the clock generated by the first rate voltage control oscillator 74 and the reproduction signal reproduced at the first channel rate. The first rate loop filter 73 removes the high frequency component of the output of the first rate phase error detector 72 so as to control the oscillation frequency of the first rate voltage control oscillator 74 with that output.

The second rate reproduction equalizer 75 corrects the frequency characteristics of the reproduction signals reproduced at the second channel rate into the desired frequency characteristics. The second rate signal discriminator 76 discriminates the output of the second rate reproduction equalizer 75 at the second sample rate so as to be decoded into the original digital data. The second rate voltage control oscillator 79 generates the clock of the basic frequency at the second channel rate, of which the frequency is variable due to the voltage. The second rate phase error detector 77 detects a phase shift between the clock generated by the second rate voltage control oscillator 79 and the reproduction signal reproduced at the second channel rate. The second rate loop filter 78 removes the high frequency component of the output of the second rate phase error detector 77 so as to control the oscillation frequency of the second rate voltage control oscillator 79 with that output.

A reproduction data switch 80 outputs an input signal from the first rate signal discriminator 71 when reproducing at the first channel rate and outputs an input signal from the second rate signal discriminator 76 when reproducing at the second channel rate. A reproduction clock switch 81 outputs an input signal from the first rate voltage control oscillator 74 when reproducing at the first channel rate and outputs an input signal from the second rate voltage control oscillator 79 when reproducing at the second channel rate.

The conventional magnetic tape reproduction unit constructed as above generates the clock in accordance with the reproduction signal of the first channel rate by a PLL (Phase Locked Loop) circuit comprising the first rate phase error detector 72, the first rate loop filter 73 and the first rate voltage control oscillator 74 when the reproducer 1 reproduces data at the first channel rate and decodes the recorded original digital data after the first rate reproduction equalizer 70 and the first rate signal discriminator 71 correct the frequency characteristics of the reproduction signal.

In the same way, when the reproducer 1 reproduces the data at the second channel rate the clock is generated in accordance with the reproduction signal of the second channel rate by a PLL (Phase Locked Loop) circuit comprising the second rate phase error detector 77, the second rate loop filter 78 and the second rate voltage control oscillator 79 and the original digital data are decoded at the second channel rate after the second rate reproduction equalizer 75 and the second rate signal discriminator 76 correct the frequency characteristics of the reproduction signal.

In the above described construction, however, a plurality of voltage control oscillators, phase error detectors, loop filters and reproduction equalizers become necessary in accordance with the plurality of reproduced channel rates.

DISCLOSURE OF THE INVENTION

A purpose of the present invention is to provide a multi-rate clock generator which makes it possible to generate clocks in accordance with a plurality of reproduction channel rates by a phase error detector, a voltage control oscillator and a loop filter, of which the loop delay and the loop sensitivity are constant irrespective of the rate.

Another purpose of the present invention is to provide a multi-rate digital data reproducing device which makes it possible to decode the reproduction signal into the recorded original digital data in accordance with a plurality of reproduction channel rates by a reproduction equalizer, a phase error detector, a voltage control oscillator and a loop filter.

A multi-rate clock generator according to the first aspect of the invention is a multi-rate clock generator for generating clocks in accordance with a plurality of reproduced channel data rates, comprising: a reproduction means for reproducing the recorded digital data at a plurality of channel data rates which are n/m (n and m are positive integers) of a predetermined basic channel rate; a clock generation means for generating the first clock corresponding to the basic frequency of the basic channel rate of which the oscillation frequency is variable; an n/m division means for the n/m division of the first clock in accordance with the channel data rate of the reproduction means so as to output the second clock; an A/D conversion means for converting an input signal inputted from the reproduction means to a digital signal with the second clock; a phase error detection means for detecting a phase shift between an output of the A/D conversion means and the second clock based on the output of the A/D conversion means so as to output a phase error signal; and a digital filter means for processing the phase error signal with the second clock, wherein the clock generation means, the division means, the phase error detection means and the digital filter means form a PLL means by controlling the oscillation frequency of the clock generation means with the output signal of the digital filter means.

According to this multi-rate clock generator, in the multi-rate clock generator for generating a reproduction clock synchronized to a reproduction signal from the reproduction signal gained by reproducing the recorded digital data at a plurality of channel data rates which is n/m (n and m are positive integers) of the basic channel rate, the second clock (reproduction clock) is gained by n/m division of the first clock which is an output of a single clock generation means which oscillates at the basic frequency of said basic channel rate. Then using the second clock the reproduction signal is A/D converted and a phase shift between the A/D converted digital data and the above described second clock is detected to find a phase error signal and the low frequency component of the phase error signal is taken out by the digital filter means so as to generate a control signal of the above described clock generation means, which generates the second clock synchronized with the reproduction data.

A loop filter used in such a PLL means is constructed with a digital filter means which uses, as its process clock, the second clock (reproduction clock) which is gained by the n/m division of the first clock which is an output of the clock generation means and, thereby, the frequency characteristics of the digital filter means vary with a division ratio of n/m in a similar manner. Therefore, a multi-rate clock generator where the loop delay and the loop sensitivity of the PLL means are always constant, even when the channel rate varies, can be implemented with only one clock generation means, one division means, one phase error detection means and one digital filter means.

That is to say, in this multi-rate clock generator, the frequency characteristics of the digital filter means vary in a similar manner by changing the division ratio of the n/m division means (from n/m=1 to n/m=1/2) even when the reproduced channel data rate varies (for example, from n/m=1 to n/m=1/2). Thereby, the PLL means comprising a clock generation means, division means, phase error detection means and a digital filter means can be implemented with a single circuit construction even in the case that the reproduction channel rate varies, and a multi-rate clock generator can be gained where the loop sensitivity and the loop delay are constant for all of the channel rates.

A multi-rate digital data reproducing device according to the second aspect of the invention is a multi-rate digital data reproducing device for reproducing recorded digital data in accordance with a plurality of reproduced channel data rates, comprising: a reproduction means for reproducing recorded digital data at a plurality of channel data rates which are n/m (n and m are positive integers) of a predetermined basic channel rate; a clock generation means for generating the first clock corresponding to the basic frequency of the basic channel rate of which the oscillation frequency is variable; an n/m division for the n/m division of the first clock in accordance with the channel data rate of the reproduction means so as to output the second clock; an A/D conversion means for converting an input signal inputted from the reproduction means to a digital signal with the second clock; a phase error detection means for detecting a phase shift between the output of the A/D conversion means and the second clock based on the output of the A/D conversion means so as to output a phase error signal; the first digital filter means for processing the phase error signal with the second clock; a reproduction equalization means comprising the second digital filter means for processing the output of the A/D conversion means with the second clock; and a discrimination means for reproducing the recorded original digital data from the output signal of the second digital filter means, wherein the multi-rate digital data reproducing device is characterized in that the clock generation means, the division means, the phase error detection means and the first digital filter means form a PLL means by controlling the oscillation frequency of the clock generation means with the output signal of the first digital filter means and that the originally recorded data are reproduced in accordance with a plurality of channel data rates which are reproduced by said second digital filter means.

According to this multi-rate digital data reproducing device, in the device which decodes a reproduction signal varying at the plurality of channel data rates which are n/m of the basic channel rate into the original recorded digital data, the filter means used in the reproduction equalization means which corrects to the frequency characteristics needed for the decoding is constructed with the second digital filter means, of which the process clock the second clock used as the reproduction clock divided to n/m. Thereby, since the frequency characteristics of the above described reproduction equalizer vary with the n/m division ratio in a similar manner, respective constants for determining the filter characteristics need not be reset or readjusted even when the reproduction channel rate varies so as to automatically have the characteristics suitable for each channel rate. Thereby, a multi-rate digital data reproducing device can be implemented with only one reproduction equalization means.

That is to say, in this multi-rate digital data reproducing device, the frequency characteristics of the first digital filter and the second digital filter vary in a similar manner by changing the division ratio of the n/m division means (from n/m=1 to n/m=1/2) even when the reproduced channel data rate varies (for example, from n/m=1 to n/m=1/2). Thereby, the PLL means comprising a clock generation means, a division means, a phase error detection means and the first digital filter means as well as the reproduction equalization means comprising the second digital filter means can be implemented with a single circuit construction even in the case that the reproduction channel rate varies, and a multi-rate digital data reproducing device can be gained of which the loop sensitivity and the loop delay are constant for all of the channel rates. The other points are the same as in the multi-rate clock generator according to the first aspect of the invention.

A multi-rate digital data reproducing device according to the third aspect of the invention is a multi-rate digital data reproducing device which corrects a reproduction signal, of which the amplitude fluctuates, to a desired amplitude level, even when the channel data rate of the reproduction signal varies, comprising: a reproduction means for reproducing recorded digital data at a plurality of channel data rates which are n/m (n and m are positive integers) of a predetermined basic channel rate; a clock generation means for generating the first clock corresponding to the basic frequency of the basic channel rate of which the oscillation frequency is variable; an n/m division means for the n/m division of the first clock in accordance with the channel data rate of the reproduction means so as to output the second clock, an A/D conversion means for gaining the first reproduction signal by converting an input signal inputted from the reproduction means to a digital signal with the second clock; a phase error detection means for detecting a phase shift between the output of the A/D conversion means and the second clock so as to output a phase error signal; the first digital filter means for processing the phase error signal with the second clock; a multiplication means for gaining the second reproduction signal by multiplying the first reproduction signal outputted by the A/D conversion means by the first control signal; an amplitude error detection means for detecting a difference between the second reproduction signal and a predetermined target level; and the second digital filter means for processing the output of the amplitude error detection means with the second clock so as to output the first control signal, wherein the clock generation means, the division means, the phase error detection means and the first digital filter means form a PLL means by controlling the oscillation frequency of the clock generation means with the output signal of the first digital filter means.

According to this multi-rate digital data reproducing device, it is understood that the frequency characteristics of the first digital filter vary in a similar manner by changing the division ratio of the n/m division means (first rate n/m=1 to n/m=1/2) even when the reproduced channel data rate varies (for example, from n/m=1 to n/m=1/2). Thereby, the PLL means comprising the phase error detection means, the loop filter, the oscillation frequency controller and a clock generation means can be realized with a single circuit construction even in the case the reproduction channel rate varies, and a multi-rate digital data reproducing device can be gained of which the loop sensitivity and the loop delay are constant for all of the channel rates.

In addition, according to this multi-rate digital data reproducing device, even when a reproduction channel rate of the reproduction signal, of which the amplitude fluctuates with the oscillation frequency having a predetermined ratio to the reproduction channel rate, varies the frequency characteristics of the filter means vary in a similar manner with the division ratio of n/m by using the second clock as the reproduction clock, which is divided to n/m for its process clock, wherein the filter means for detecting the above described amplitude fluctuation frequency is constructed with the second digital filter means. Therefore, even when the reproduction channel rate varies, it is not necessary to reset or readjust respective constants for determining the filter characteristics, which makes it possible to automatically detect the amplitude fluctuation frequency suitable for each channel rate. Thereby, a multi-rate digital data reproducing device with an amplitude fluctuation correction function can be implemented with only one filter means. The other effects are the same in the multi-rate clock generator according to the first aspect of the invention.

A multi-rate digital data reproducing device according to the fourth aspect of the invention is a multi-rate digital data reproducing device for detecting, from a reproduction signal of which the standard signal is multiplied to a predetermined frequency which is, when a channel data rate varies, 1/d of the channel data rate, the standard signal so as to detect the condition of the reproduced signal, comprising: a reproduction means for reproducing recorded digital data with a plurality of channel data rates which are n/m (n and m are positive integers) of a predetermined basic channel rate; a clock generation means for generating the first clock corresponding to the basic frequency of the basic channel rate of which the oscillation frequency is variable; an n/m division means for the n/m division of the first clock in accordance with the channel data rate of the reproduction means so as to output the second clock; an A/D conversion means for converting an input signal inputted from the reproduction means to a digital signal with the second clock so as to gain the first reproduction signal; a phase error detection means for detecting a phase shift between the output of the A/D conversion means and the second clock based on the output of the A/D conversion means so as to output a phase error signal; the first digital filter means for processing the phase error signal with the second clock, the second digital filter means for processing the first reproduction signal outputted by the A/D conversion means with the second clock so as to pass a predetermined frequency which is 1/d of the channel data rate; and a reproduction condition detection means for detecting the reproduction condition of the first reproduction signal by detecting the signal level which passes through the second digital filter means, wherein the clock generation means, the division means, the phase error detection means and the first digital filter means form a PLL means by controlling the oscillation frequency of the clock generation means with the output signal of the first digital filter means.

According to this multi-rate digital data reproducing device the frequency characteristics of the first digital filter vary in a similar manner by varying the division ratio of the n/m division means (first rate n/m=1 to n/m=1/2) even when the reproduced channel data rate varies (for example, first rate n/m=1 to n/m=1/2). Thereby, the PLL means comprising a phase error detection means, a loop filter, an oscillation frequency controller and a clock generation means can be implemented with a single circuit construction even in the case that the reproducing channel rate varies, and a multi-rate digital data reproducing device can be gained of which the loop sensitivity and the loop delay are constant for all the channel rates.

In addition, according to this multi-rate digital data reproducing device, even when the reproduction channel rate of the reproduction signal, with which a pilot signal with the frequency having a predetermined ratio to the reproduction channel rate is multiplied in frequency, varies the frequency characteristics of the filter means varies in a similar manner with a division ratio of n/m by constructing the filter means for detecting the above described pilot signal with the second digital filter means and by using the second clock as the reproduction clock gained by the n/m division of the process clock. Therefore, even when the reproduction channel rate varies, it is not necessary to reset or to readjust respective constants for determining filter characteristics, which makes it possible to automatically detect the pilot signal suitable for respective channel rates. Thereby, a multi-rate digital data reproducing device with a power signal detection function can be implemented with only one filter means. The other points are the same as in the multi-rate clock generator according to the first aspect of the invention.

THE BEST MODE FOR CARRYING OUT THE INVENTION

In the following the embodiments of the multi-rate clock generator and the multi-rate digital data reproducing device according to the present invention are described in reference to the drawings citing an example of a helical scan-type digital video tape recorder.

First Embodiment

Figure 1:
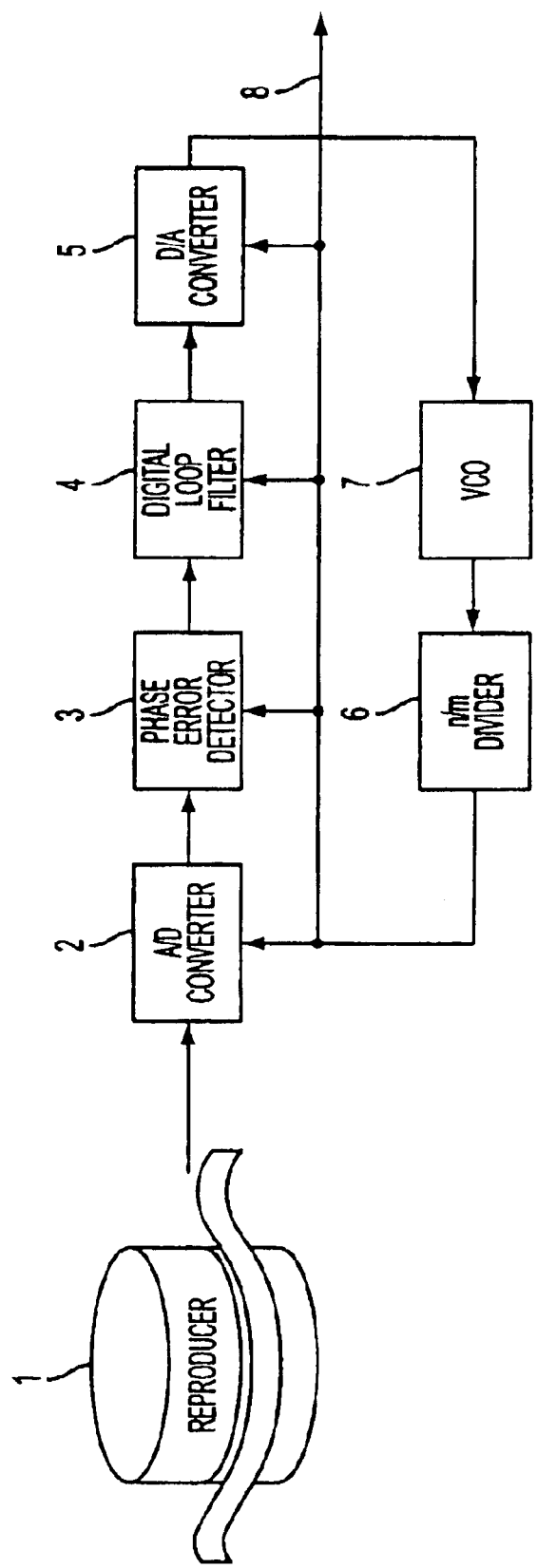
FIG. 1 is a block diagram showing the construction of a multi-rate clock generator according to the first embodiment of the present invention.

FIG. 1 is a block diagram showing the construction of a multi-rate clock generator according to the first embodiment of the present invention. In FIG. 1, a reproducer 1 comprises a rotating cylinder, a magnetic head and a reproduction amplifier of a helical scan-type digital video tape recorder, which corresponds to the reproduction means in the scope of the claims. And it is possible to reproduce at the channel rate of n/m of the channel rate when the digital data recorded on a magnetic tape are recorded by varying the number of cylinder revolutions and the tape speed.

A voltage control oscillator 7 is variable in the oscillation frequency by voltage, which corresponds to the clock generation means for generating the first clock in the scope of the claims. An n/m divider 6 divides the input signal into n/m (n and m are positive integers) which corresponds to the n/m division means for outputting the second clock in the scope of the claims.

An A/D converter 2 converts an analog signal into a digital signal, which corresponds to the A/D conversion means in the scope of the claims. A phase error detector 3 detects a phase shift between two signals, which correspond to the phase error detection means in the scope of the claims. A digital loop filter 4 comprises a low pass digital filter, which corresponds to the digital filter means in the scope of the claims. A D/A converter 5 as a D/A conversion means converts a digital signal for each sample into an analog signal. A reproduction clock 8 outputted from the n/m divider 6 becomes a reproduction clock outputted from the present multi-rate clock generator.

The above described phase error detector 3, digital loop filter 4, D/A converter 5, voltage control oscillator 7 and n/m divider 6 form a PLL circuit (the PLL means in the scope of the claims).

Figure 2:
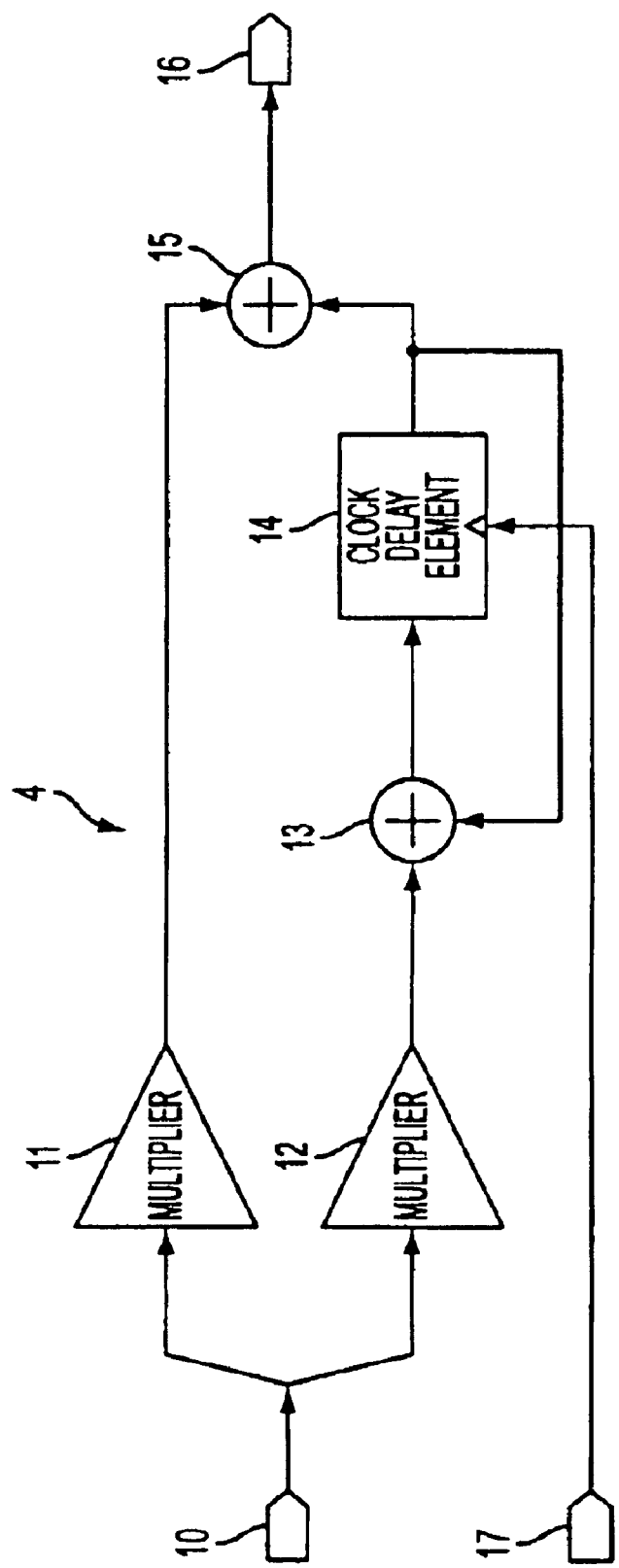
FIG. 2 is a block diagram showing a concrete example of a digital loop filter of FIG. 1.

In addition, FIG. 2 is a block diagram showing an example of the concrete construction of a digital loop filter 4 in the multi-rate clock generator of this embodiment. In FIG. 2, the reference numeral 10 denotes an input terminal for inputting the output signal of the phase error detector 3. The reference numeral 17 denotes an input terminal for inputting the reproduction clock (the second clock) 8. The reference numerals 11 and 12 denote multipliers for multiplying coefficients a and b, respectively, by an input signal added from the input terminal 10. The reference numerals 13 and 15 denote adders for adding two inputs to be outputted. The reference numeral 14 denotes 1 clock delay element for delaying the data by one clock of the reproduction clock 8 inputted from the input terminal 17. The reference numeral 16 denotes an output terminal of the digital loop filter 4.

The operation of the multi-rate clock generator constructed as in the above is described by citing an example as when a recording tape of DVCPRO50 and DVCPRO, which are digital video tape recorders for broadcasting tasks, is reproduced. In the following the operation is described in reference to FIGS. 1 and 2.

In this embodiment, in the case when a recording tape of DVCPRO50 is reproduced, the cylinder of the reproducer 1 rotates at 9000 rpm, while the channel rate of the reproduction data which is reproduced therefrom is about 42 Mbps. At this time the central frequency of the voltage control oscillator 7 oscillates the standard clock, at 42 MHz, which is equal to the sampling frequency of the reproduction channel data rate. The n/m divider 6 outputs the reproduction clock 8 at 42 MHz without dividing the above described standard clock (n, m=1).

The A/D converter 2 converts a reproduction signal from the reproducer 1 to a digital signal through the sampling of the above described reproduction clock 8. Based on the output data of the A/D converter 2, the phase error detector 3 detects a phase shift between the output data of the A/D converter 2 and the reproduction clock 8 so as to output a phase error signal in accordance with the amount and the direction of the phase shift. The above described phase error signal is inputted to the digital loop filter 4.

The digital loop filter 4 is a low pass digital filter constructed of an integral circuit comprising a multiplier 12, an adder 13 and 1 clock delay element, and an entire band pass circuit with an amplification factor a comprising a multiplier 11 as shown in FIG. 2. That is to say, the inputted phase error signal is removed in the high frequency component by the digital loop filter 4 so that a control signal is outputted so as to control the frequency of the voltage control oscillator 7 from the digital loop filter 4. The above described control signal is converted from a digital signal to an analog signal by the D/A converter 5 to be fed to the voltage control oscillator 7.

Next, in the case that a recording tape of DVCPRO is reproduced, a head mounted on the rotating cylinder of the reproducer 1 is on track of the tape track, which rotates at 4,500 rpm. Therefore, the channel rate of the reproduced reproduction data becomes about 21 Mbps which is one half of the case where the recording tape of DVCPRO50 is reproduced. At this time, even when the reproduction channel rate converts into one half, the voltage control oscillator 7 oscillates the standard clock of which central frequency is 42 MHz. On the contrary, the division ratio of the n/m divider 6 becomes 1/2 (n=1, m=2) so that the reproduction clock 8 is outputted at 21 MHz.

The A/D converter 2 converts the reproduction signal from the reproducer 1 into a digital signal through sampling by the above reproduction clock 8. The phase error detector 3 detects a phase shift between the output data of the A/D converter 2 and the reproduction clock 8 based on the output data of the A/D converter 2 so as to output a phase error signal in accordance with the amount and the direction of the phase shift. The phase error signal is inputted to the digital loop filter 4.

The inputted phase error signal has the high frequency components removed by the digital filter 4 so that a control signal is outputted which controls the frequency of the voltage control oscillator 7from the digital loop filter 4. The control signal is converted to an analog signal from the digital signal by the D/A converter 5, which is fed to the voltage control oscillator 7.

In this embodiment, as described above, in the case that the channel rate of the reproduction signal reproduced from the reproducer 1 varies at n/m of the channel recording rate at the time of recording, it becomes possible to implement the generation of a clock in accordance with the reproduction signal of which the reproduction channel rate varies with only one voltage control oscillator 7 by using the reproduction clock 8 gained through the n/m division of the output of the voltage control oscillator 7 which oscillates at the basic channel rate.

In addition, the control signal which controls the voltage control oscillator 7 is generated by the phase error detector 3 and the digital loop filter 4. Since those circuits are constructed with analog circuits according to a prior art, it has been necessary to adapt the frequency characteristics by readjusting the respective constants of the circuits whenever the reproduction channel rate varies or to provide filter circuits in the number of the plurality of the reproduction channel rates. On the other hand, in the embodiment of the present invention, by constructing this loop filter with the digital loop filter 4, which processes using the reproduction clock gained through the n/m division, even when the reproduction channel rate varies at a ratio of n/m the frequency characteristics vary in a similar manner accordingly. And, at this time, the coefficients a, b of the digital loop filter in FIG. 2 are constant irrespective of the rate. That is to say, once the coefficient is determined in accordance with the system then it is not necessary to change even when the rate varies. Without changing the coefficients a, b, by using the clock gained through the n/m division as a processing clock of the digital loop filter 4, the frequency characteristics automatically change in a similar manner in accordance with the rate. Therefore, the PLL circuit corresponding to the plurality of reproduction channel rates can be constructed by using only one digital loop filter 4 so that a multi-rate clock generator can be gained of which the loop delay and the loop sensitivity are constant without readjusting the frequency characteristics regarding respective reproduction channel rates.

Though it is described above that the coefficients a, b are constant irrespective of the rate, a minor modification may be carried out for a fine adjustment of the frequency characteristics of the loop filter. In that case, however, the width of the modified coefficients may be small and only the lower number of bits in the coefficient bit width may be modified so that the simplification of the circuit can be implemented by using the structure of the present invention.

Second Embodiment

Figure 3:
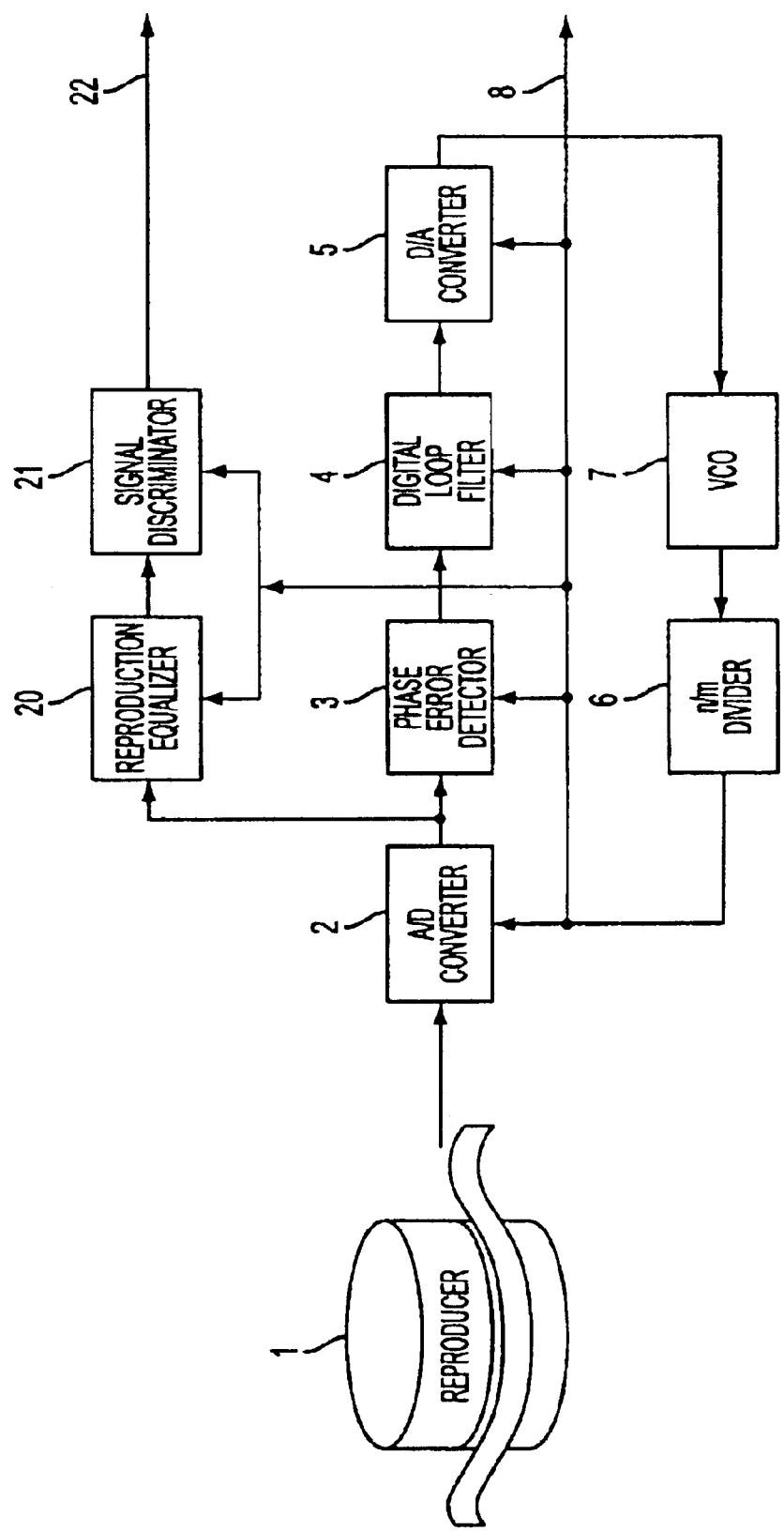
FIG. 3 is a block diagram showing the construction of a multi-rate digital data reproducing device according to the second embodiment of the present invention.

FIG. 3 is a block diagram showing the construction of a multi-rate digital data reproducing device of the second embodiment according to the present invention. In FIG. 3, the reproducer 1 comprises a rotation cylinder, a head and a reproduction amplifier of a helical scan-type digital video tape recorder, which is able to reproduce at the channel rate of n/m of the channel recording rate at which the digital data recorded on the magnetic tape has been recorded by changing the number of cylinder revolutions and the tape speed.

The voltage control oscillator 7 is variable in the oscillation frequency due to the voltage. The n/m divider 6 is for the n/m division (n, m are positive integers) of the input signal. The A/D converter 2 is for converting an analog signal into a digital signal. The phase error detector 3 is for detecting a phase shift between two signals. The digital loop filter 4 comprises a low pass digital filter which corresponds to the first digital filter means in the scope of the claims. The D/A converter 5 as a D/A conversion means converts the digital signal to an analog signal for each sample. The reproduction clock 8 outputted from the n/m divider 6 is used as the reproduction clock outputted from the present multi-rate clock generator.

The above is the same as the construction of FIG. 1 in the first embodiment, of which a detailed description is omitted. A point of difference from the first embodiment is that the reproduction equalizer 20 which corresponds to the reproduction equalization means in the scope of the claims and the signal discriminator 21 which corresponds to the discrimination means in the scope of the claims are added as new parts of the construction.

Figure 4:
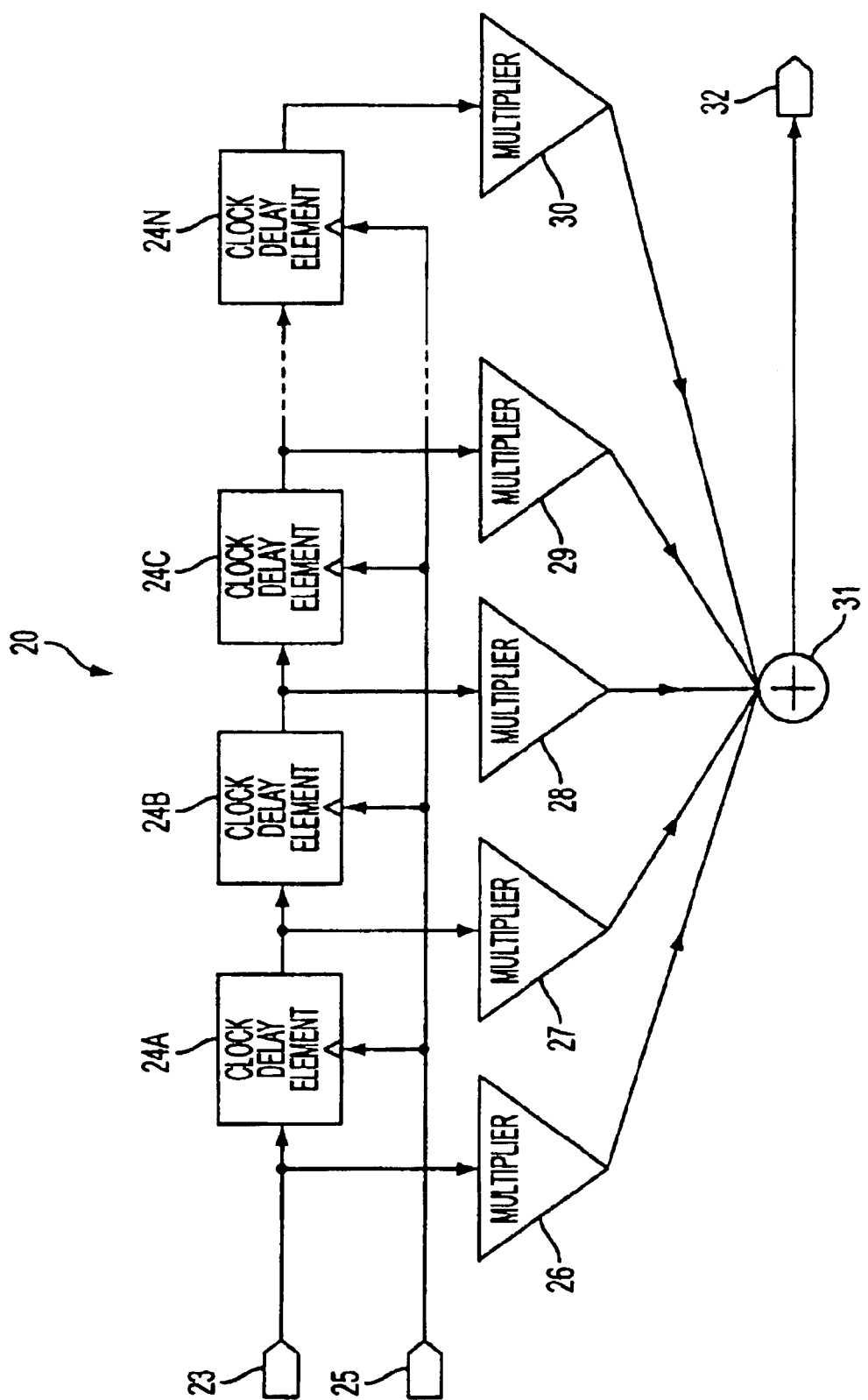
FIG. 4 is a block diagram showing a concrete example of a reproduction equalizer of FIG. 3.

FIG. 4 is a block diagram showing an example of a concrete structure of the reproduction equalizer 20 in the multi-rate digital data reproducing device of this embodiment. In FIG. 4, the reference numeral 23 denotes an input terminal for inputting the output signal of the A/D converter 2. The reference numeral 25 denotes an input terminal for inputting the reproduction clock 8. The numerals 24A, 24B, 24C ..., 24N denote 1 clock delay elements for delaying data by one clock of the reproduction clock 8 inputted from the input terminal 25. The reference numerals 26, 27, 28, 29 and 30 denote multipliers for multiplying coefficients a0, a1, a2, a3, ..., aN by the output signals of respective 1 clock delay elements 24A, 24B, 24C, ..., 24N. The reference numeral 31 denotes an adder for adding the outputs of respective multipliers 26, 27, 28, 29 and 30. The reference numeral 32 denotes an output terminal of the reproduction equalizer 20.

In the following, the operations of the reproduction equalizer 20 and signal discriminator 21 are described in reference to FIGS. 3 and 4. The reproduction equalizer 20 is a digital filter (the second digital filter means in the scope of the claims) for correcting the frequency characteristics of the output signal of the A/D converter 2 to the desired characteristics. As a concrete construction of that, a transversal filter of N taps as shown in FIG. 4 may be used. Since the operation of the transversal filter is well known a detailed description is omitted, and the frequency characteristics of the filter are determined by the coefficients a0, a1, a2, a3, . . . , aN of the multipliers 26 to 30.

The signal discriminator 21 detects the level of the signal inputted from the reproduction equalizer 20 and decodes the originally recorded digital data from the detection result so as to be outputted. As an example of the processing circuit, the Viterbi decoder can be cited.

The construction described above in this embodiment can achieve the following effects. As described in the first embodiment, the reproducer 1 is a reproducer of which the reproduction channel rate varies at n/m and an example of which is where the channel rate changes to 21 Mbps which is ½ of the basic channel rate of 42 Mbps. A digital video tape recorder has the characteristics where the frequency characteristics of the reproduced reproduction data vary in a similar manner to the channel rate even when the reproduction channel rate varies to ½ in the same way.

In a conventional unit, however, the reproduction equalizer for correcting the frequency characteristics of the reproduction signal is constructed with an analog filter therefore the reproduction equalizers in the number of varying reproduction channel rates are necessary.

On the other hand, in order to solve this problem, in this embodiment, the filter circuit used for the reproduction equalizer 20 is constructed with a digital filter, which is characterized in that its processing clock is processed using the reproduction clock 8 gained through the n/m division. Thereby, even when the reproduction channel rate changes the frequency characteristics of the filter vary automatically in a similar manner in accordance with the change. At this time the above described coefficients a0 to aN are constant irrespective of the rate, which don't need to be changed according to the rate once being determined in accordance with the system. Therefore, a multi-rate digital data reproducing device can be provided which makes it possible to decode the reproduction data using only one PLL circuit and reproduction equalizer 20.

Though it is described above that the coefficients a0 to aN are constant irrespective of the rate, a minor modification may be carried out for a fine adjustment of the frequency characteristics. In that case, however, the width of the modified coefficients is small and only the lower number bits of the coefficient bit width may be modified so as to implement the simplification of the circuit by using the construction of the present invention.

Third Embodiment

Figure 5:
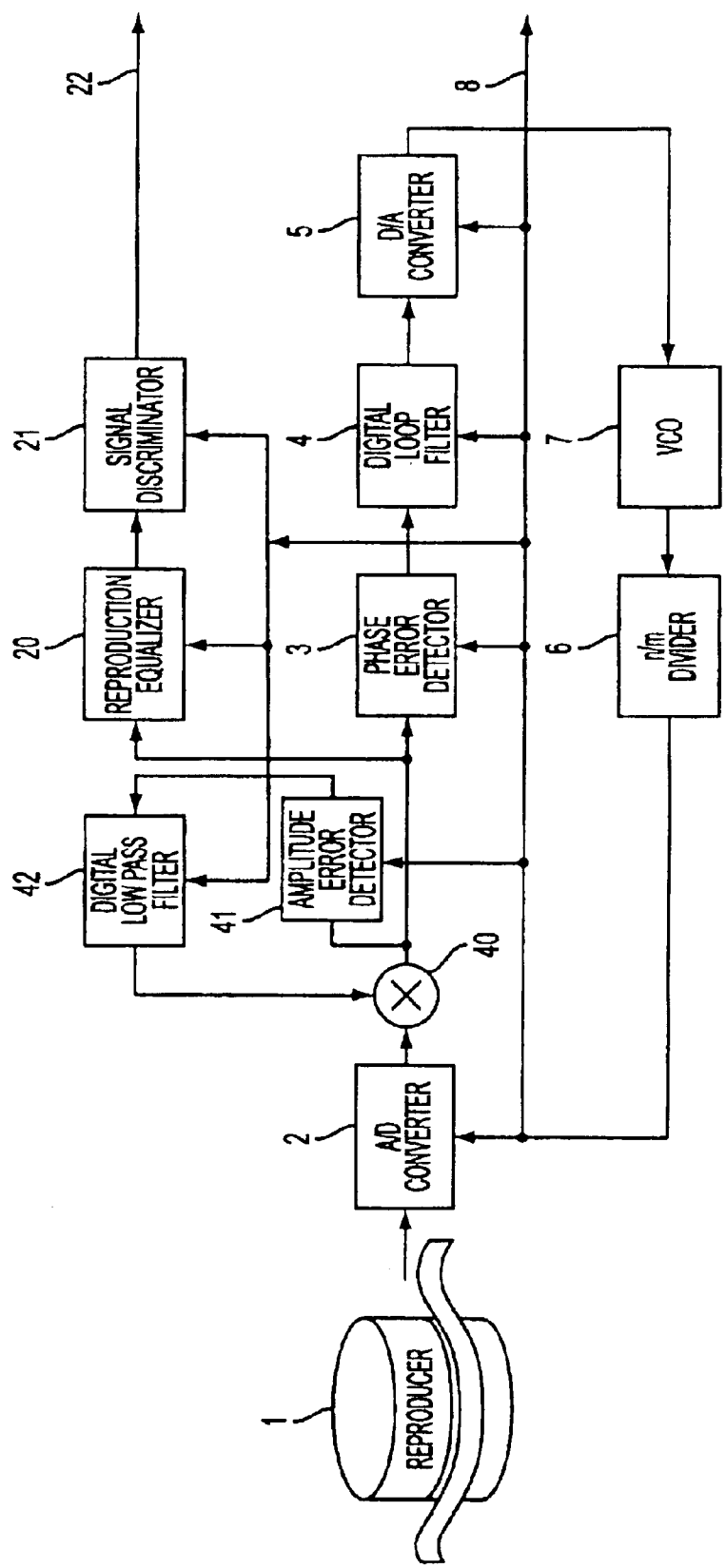
FIG. 5 is a block diagram showing the construction of a multi-rate digital data reproducing device according to the third embodiment of the present invention.

FIG. 5 is a block diagram showing a construction of a multi-rate digital data reproducing device of the third embodiment according to the present invention. In FIG. 5, the reproducer 1 comprises a rotation cylinder, a head and a reproduction amplifier of a helical scan-type digital video tape recorder, which is able to reproduce at the channel rate of n/m of the channel recording rate at which the digital data recorded on the magnetic tape has been recorded by changing the number of cylinder revolutions and the tape speed.

The voltage control oscillator 7 is variable in the oscillation frequency due to the voltage. The n/m divider 6 is for the n/m division (n, m are positive integers) of the input signal. The A/D converter 2 is for converting an analog signal into a digital signal. The phase error detector 3 is for detecting a phase shift between two signals. The digital loop filter 4 comprises a low pass digital filter which corresponds to the first digital filter means in the scope of the claims. The D/A converter 5 as a D/A conversion means converts the digital signal to an analog signal for each sample. The reproduction clock 8 outputted from the n/m divider 6 is used as the reproduction clock outputted from the present multi-rate clock generator. The reproduction equalizer 20 is a digital filter for correcting the frequency characteristics of the output signal of the A/D converter 2 to the desired characteristics. The signal discriminator 21 detects the level of the signal inputted from the reproduction equalizer 20 and decodes the originally recorded digital data from the detection result so as to outputted.

The above is the same as the construction of FIG. 3 in the second embodiment, of which the description is omitted in detail. A point of difference from the second embodiment is that the multiplier 40, which corresponds to the multiplication means in the scope of the claims, and an amplitude error detector 41, which corresponds to the amplitude error detection means in the same way, and a digital low pass filter 42, which corresponds to the second digital filter means in the same way, are added as new parts of the construction.

Figure 6:
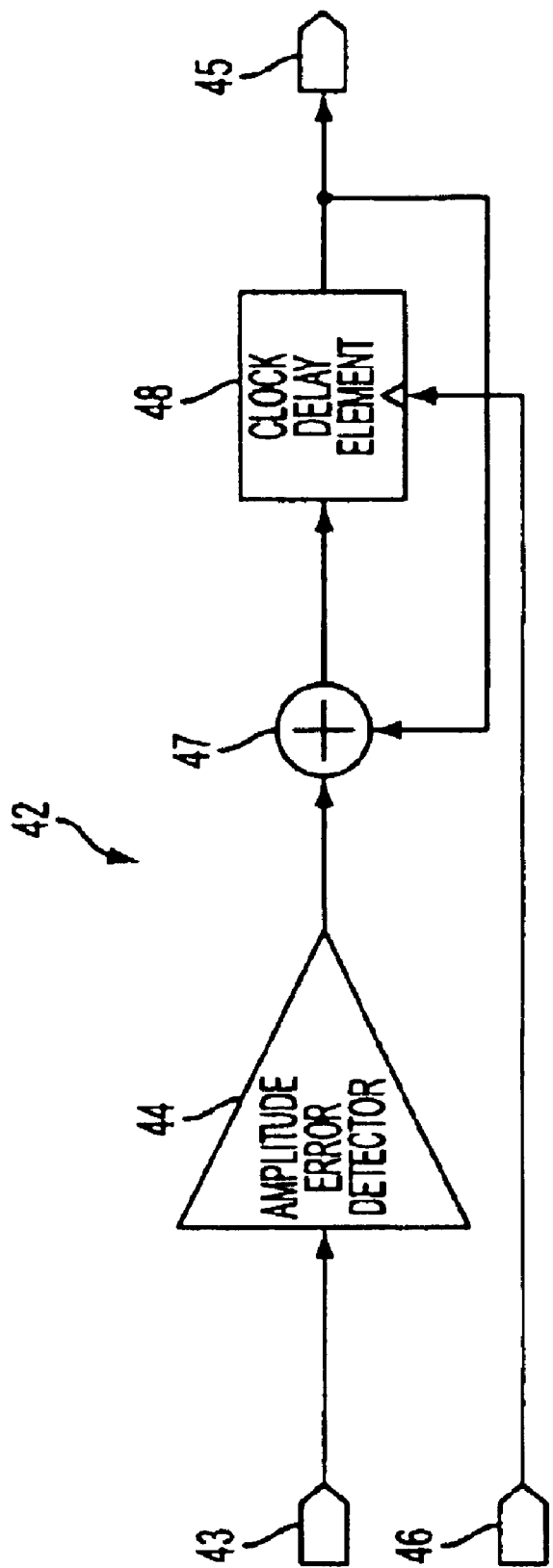
FIG. 6 is a block diagram showing a concrete example of a digital low pass filter of FIG. 5.

FIG. 6 is a block diagram showing an example in a concrete construction of the digital low pass filter 42 of this embodiment. In FIG. 6, the reference numeral 43 denotes an input terminal for inputting the output signal of the amplitude error detector 41. The reference numeral 46 denotes an input terminal for inputting the reproduction clock 8. The reference numeral 44 denotes a multiplier for multiplying the input signal by a coefficient a. The reference numeral 47 denotes an adder for adding two inputs. The reference numeral 48 denotes 1 clock delay element for delaying data by one clock of the inputted reproduction clock 8. The reference numeral 45 denotes an output terminal of the digital low pass filter 42.

In the following, the operations of the amplitude error detector and the digital low pass filter 42 are described with reference to FIGS. 5 and 6. The amplitude error detector 41 finds 4 a difference between the output signal of the A/D converter 2 and the desired amplitude level to be outputted as an amplitude error signal. And the digital low pass filter 42 has the high frequency components of the amplitude error signal removed, of which the concrete construction may use an integral circuit comprising one clock layer element 48 and an adder 47 as shown in FIG. 6. The operation of the integral circuit, of which a detailed description is omitted, is well known in the art and the frequency characteristics of the filter are determined by the coefficient a of the multiplier 44. Then, in accordance with the value of the amplitude error signal which has passed through the digital low pass filter 42, the coefficient a is multiplied at the multiplier 40 so that the amplitude of the output signal of the A/D converter 2 becomes of the desired level.

The above described construction in this embodiment achieves the following effects. As for a video tape recorder the magnetic tape is rewound or fast forwarded at high speed in order to find the leading part of the tape material. At this time since the magnetic head is not on track on the tape track, the amplitude of the reproduction signal fluctuates with the oscillation frequency found by a product of "the number of cylinder revolutions per second" and "the multiplication factor of the search speed."

The reproducer 1 varies in the number of revolutions from 9000 rpm to 4500 rpm, which is ½ of the former value, when the basic channel rate of 42 Mbps changes to the channel rate of 21 Mbps, which is ½ of the former value, therefore it is understood that the oscillation number of the amplitude fluctuation at the time of a search conducted at N times the standard speed varies from 150·N to 75·N in a similar manner with a ratio of 1/2.

In a conventional unit, however, the filter circuit for detecting the above described oscillation number from the amplitude error signal, which is the difference between the actual amplitude and the targeted amplitude levels, is constructed with an analog filter therefore the filter circuits of different characteristics, of which the number is the same as that of the varying reproduction channel rates, have been necessary.

On the other hand, in order to solve this problem in this embodiment, the filter circuit is constructed with a digital low pass filter 42 which is characterized in that its processing clock is processed with the reproduction clock 8 gained through the n/m division. Thereby, even when the reproduction channel rate changes the frequency characteristics of the digital low pass filter 42 automatically vary in a similar manner in accordance with the change. At this time the coefficient a of the multiplier 44 is constant irrespective of the rate, which need not be changed according to the rate once it is determined in accordance with the system. Therefore, a multi-rate digital data reproducing device can be achieved where an amplitude fluctuation of the reproduction data is detected using only one filter circuit, the stabilization of the amplitude level is implemented and it becomes possible to decode the reproduction signal with higher precision even when the amplitude fluctuates at the time of search in the video tape recorder.

Though it is described above that the coefficient a is constant irrespective of the rate, a minor modification may be carried out for a fine adjustment of the frequency characteristics. In this case, however, the width of the modified coefficient may be small and only the lower number bits of the coefficient bit width may be modified so that the simplification of the circuit can be implemented by using the construction of the present invention.

Fourth Embodiment

Figure 7:
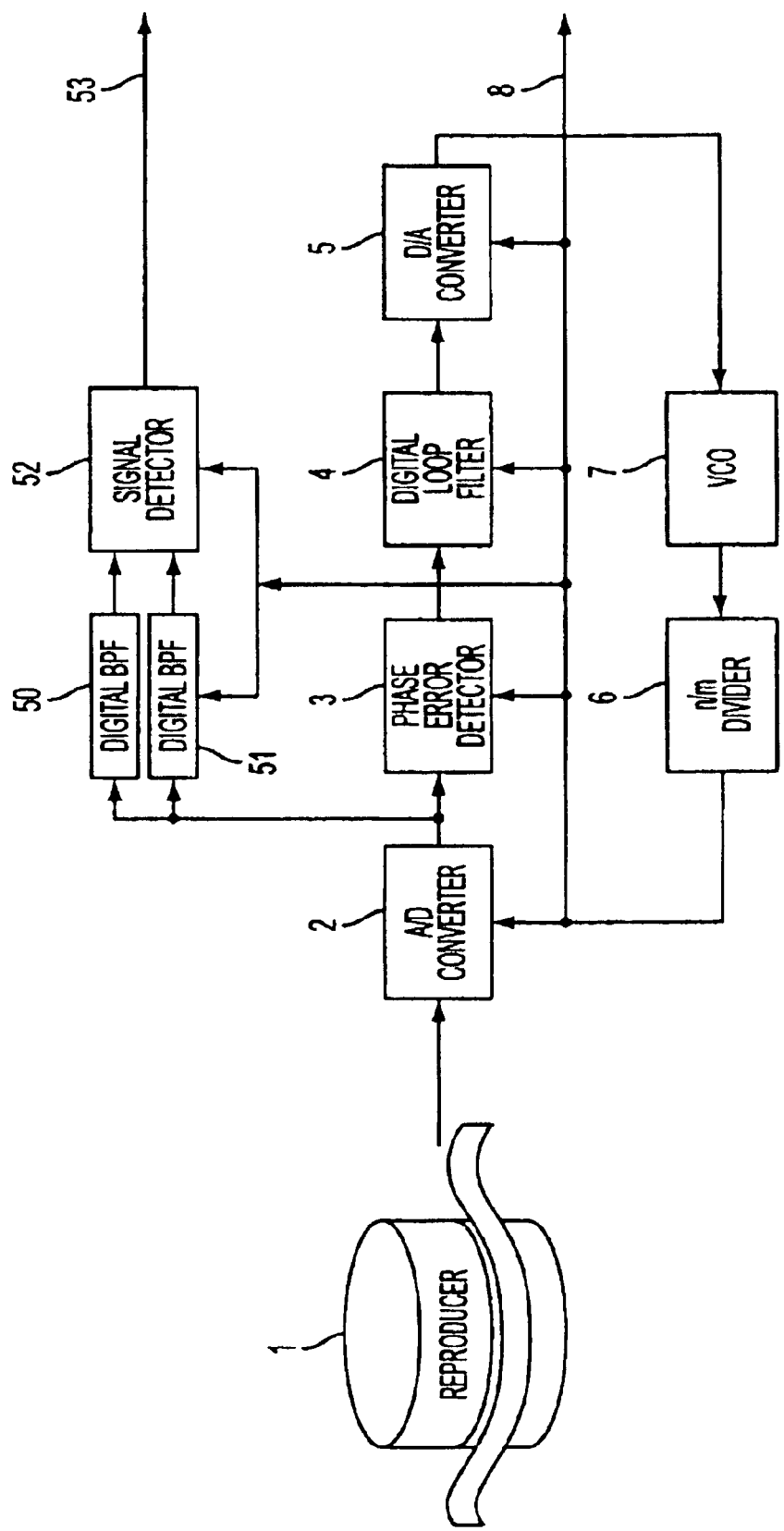
FIG. 7 is a block diagram showing the construction of a multi-rate digital data reproducing device according to the fourth embodiment of the present invention.

FIG. 7 is a block diagram showing the construction of a multi-rate digital data reproducing device of the fourth embodiment according to the present invention. In FIG. 7, the reproducer 1 comprises a rotating cylinder, a magnetic head and a reproduction amplifier of a helical scan-type digital video tape recorder, which is able to reproduce at the channel rate of n/m of the channel recording rate at which the digital data recorded on the magnetic tape has been recorded by changing the number of cylinder revolutions and the tape speed.

The voltage control oscillator 7 is variable in the oscillation frequency due to the voltage. The n/m divider 6 is an n/m divider for the n/m division (n, m are positive integers) of the input signal. The A/D converter 2 converts an analog signal into a digital signal. The phase error detector 3 detects a phase shift between two signals. The digital loop filter 4 comprises a low pass digital filter which corresponds to the first digital filter means. The D/A converter 5, which corresponds to the D/A conversion means, converts a digital signal into an analog signal for every sample. The reproduction clock 8 outputted from the n/m divider 6 becomes a reproduction clock outputted from the present multi-rate clock generator.

The above described construction is the same as in FIG. 1 according to the first embodiment, of which the detailed description is omitted. The different point from the first embodiment is that digital band pass filters 50, 51, which correspond to the second digital filter means in the scope of the claims, and a signal detector 52, which corresponds to the reproduction condition detection means in the scope of the claims, are added as new parts of the construction. Though not shown in the FIG., similar constructions of the reproduction equalizer 20 and the signal discriminator 21 as shown in FIG. 3 may, of course, be added to the circuit of FIG. 7 so that the reproduction data can be gained in the same way as in FIG. 3.

Figure 8:
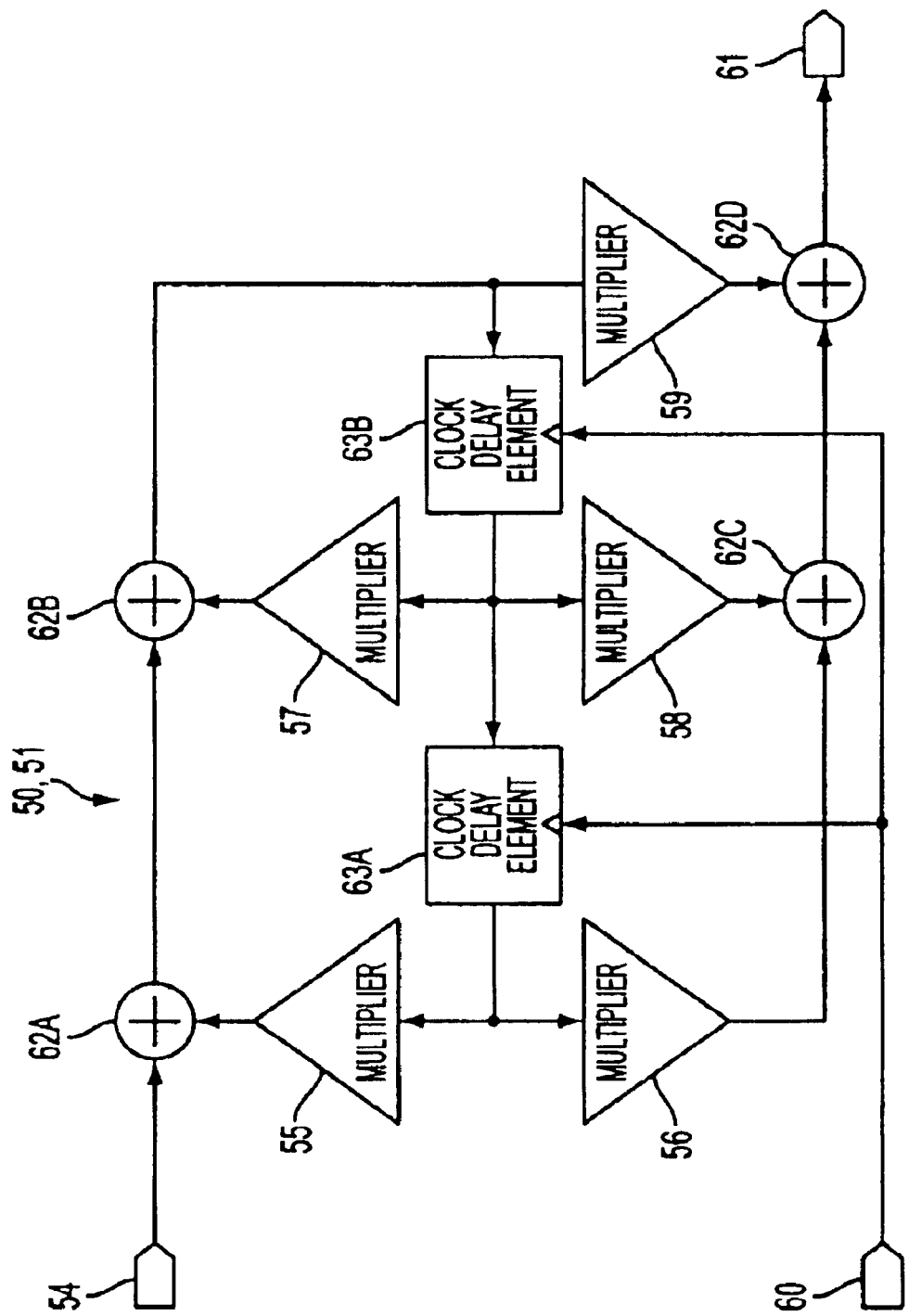
FIG. 8 is a block diagram showing a concrete example of a digital band pass filter of FIG. 7.
Figure 9:
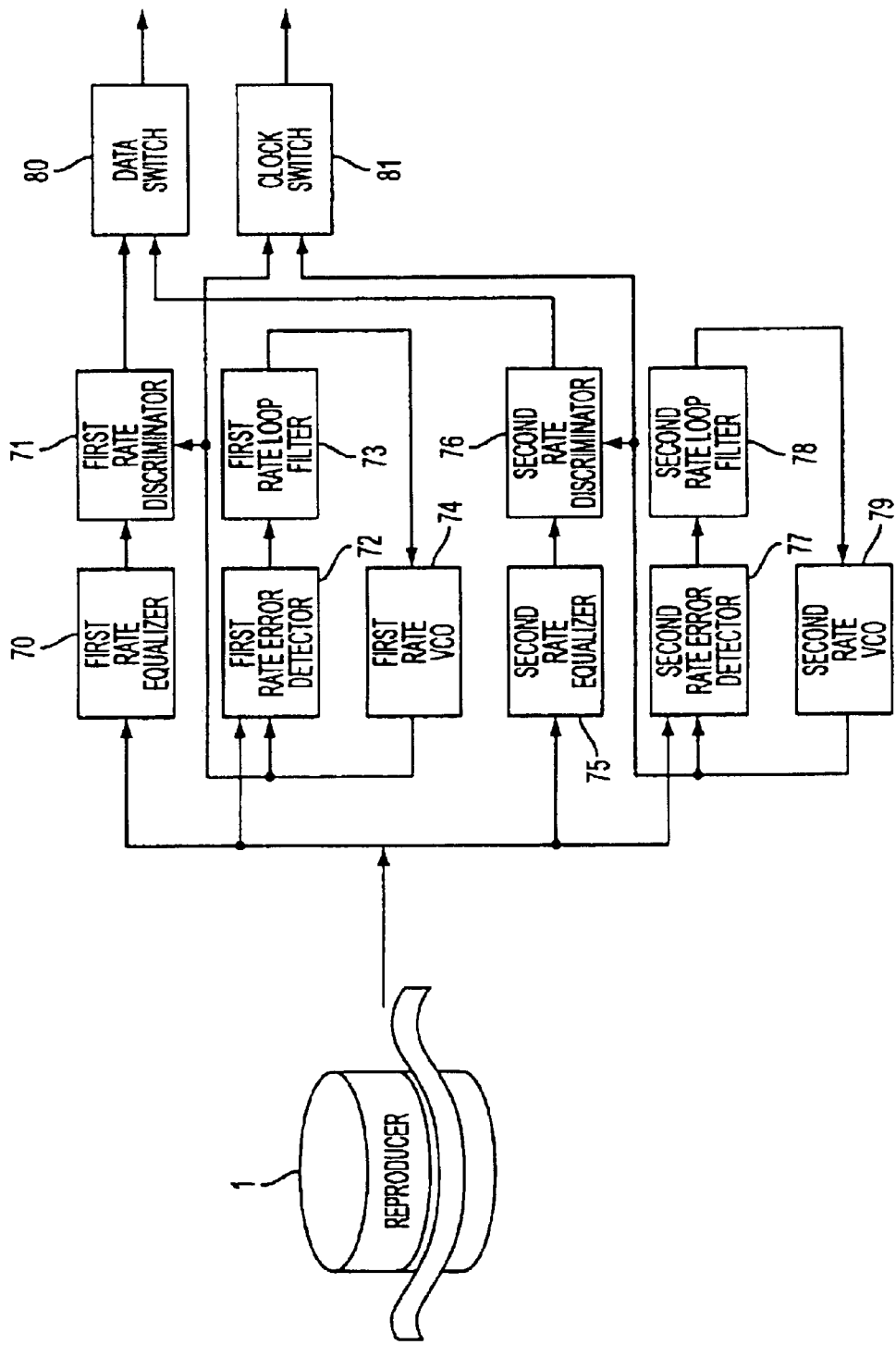
FIG. 9 is a block diagram showing the construction of a multi-rate clock generator and a multi-rate digital data reproducing device according to a prior art.

In addition, FIG. 8 is a block diagram showing an example of a concrete construction of the digital band pass filter 50 (or 51) in the multi-rate digital data reproducing device of this embodiment. In FIG. 8, the reference numeral 54 denotes an input terminal for inputting the output signal of the A/D converter 2. The reference numeral 60 denotes an input terminal for inputting the reproduction clock 8. The reference numerals 62A, 62B, 62C and 62D denote adders for adding two inputs. The reference numerals 55, 56, 57, 58 and 59 denote multipliers for multiplying the input signal by coefficients a0, a1, a2, a3 and a4. The reference numerals 63A and 63B denote 1 clock delay elements for delaying data by 1 clock of the inputted reproduction clock 8. The reference numeral 61 denotes an output terminal of the digital band path filters 50 and 51.

In the following, the operations of the digital band pass filters 50, 51 and the signal discriminator 52 are described with reference to FIGS. 7 and 8. The digital band pass filter 50 is a digital band pass filter for allowing the passage of the frequency band, which is 1/90 (corresponding to 1/d in the scope of the claims) of the reproduction channel rate (for example, 467 KHz when the reproduction channel rate is 42 Mbps).

The digital band pass filter 51 is a digital band pass filter for allowing the passage of the frequency band, which is 1/60 (corresponding to 1/d in the scope of the claims) of the reproduction channel rate (for example, 700 KHz when the reproduction channel rate is 42 Mbps).

As a concrete construction, an IIR (Infinite Impulse Response) filter (cyclic type filter) comprising 1 clock delay elements 63A, 63B, adders 62A, 62B, 62C, 62D and multipliers 55, 56, 57, 58, 59 may be used as shown in FIG. 8. Though the operation of the IIR filter, of which the description is omitted, is well known in the art, the frequency characteristics of the filter are determined by the coefficients of the multipliers 55 to 59. And the signal discriminator 52 outputs the result of the discriminated condition of the reproduction signal by using the output results of the digital band pass filters 50 and 51.

The above described construction in this embodiment can achieve the following effects. In a digital video tape recorder such as DVCPRO, a pilot signal is added by using 24/25 modulations for each track of the recording signal. As types of track where a pilot signal is added, there is an f1 track, where a signal is multiplied to the frequency of 1/90 of the channel recording rate, an f2 track, where a signal is multiplied to the frequency of 1/60, and an f0 track, which does not undergo multiplication, which are recorded on the tape in the order of f0, f1, f0, f2 . . . The detailed description is omitted since it is already described in "Data Compression and Digital Modulation" (Nikkei Electronics Books, 1993.10.1#P137 to 152). The tracking condition of the head reproducing at the present time point is detected using the amount frequency components of f1 and f2 included in the reproduction signal so as to be fed back to the servo circuit for controlling the tape movement, thereby implementing a more precise tracking.

As shown in this embodiment, when the reproducer 1 changes in the channel reproduction rate to 21 Mbps which is ½ of 42 Mbps of the basic channel rate, it is understood that the frequency of the pilot signal also changes to ½ in a similar manner.

In a conventional unit, however, the band pass filter circuit for detecting this pilot signal is constructed with an analog filter, therefore, the same number of filter circuits of the different characteristics as the varying reproduction channel rates have been necessary.

On the other hand, in order to solve this problem, this embodiment is characterized in that the filter circuit is constructed of the digital band pass filters 50, 51 of which the processing clock is processed with the reproduction clock 8 gained through the n/m division. Thereby, when the reproduction channel rate changes, the frequency characteristics of the filter automatically vary in accordance with the change in a similar manner. At this time the coefficients of the multipliers 55 to 59 are constant irrespective of the rate, which need not be changed in accordance with the rate once it is determined according to the system. Therefore, a multi-rate digital data reproducing device can be gained which is able to detect, with only one filter circuit, a desired pilot signal included in the reproduction data.

Though it is described above that the coefficients of multipliers 55 to 59 are constant irrespective of the rate, a minor modification may be carried out for a fine adjustment of the frequency characteristics. Even in that case, however, the width of the modified coefficients may be small and only the lower number bit of the coefficient bit width may be changed so as to implement the simplification of the circuit by using the construction of the present invention.

What is claimed is:

1. A multi-rate clock generator for generating clocks in accordance with a plurality of reproduced channel data rates, comprising:

a reproduction means for reproducing recorded digital data at a plurality of channel data rates which are n/m (n and m are positive integers) of a predetermined basic channel rate;

a clock generation means for generating a first clock corresponding to the basic frequency of the basic channel rate of which the oscillation frequency is variable;

an n/m division means for n/m division of said first clock in accordance with the channel data rate of said reproduction means so as to output a second clock;

an A/D conversion means for converting an input signal inputted from said reproduction means to a digital signal with said second clock;

a phase error detection means for detecting a phase shift between the output of said A/D conversion means and said second clock based on the output of said A/D conversion means so as to output a phase error signal; and a digital filter means for processing said phase error signal with said second clock, wherein said clock generation means, said division means, said phase error detection means and said digital filter means form a PLL means by controlling the oscillation frequency of said clock generation means with the output signal of said digital filter means.

2. A multi-rate digital data reproducing device for reproducing recorded digital data in accordance with a plurality of reproduced channel data rates, comprising:

a reproduction means for reproducing recorded digital data at a plurality of channel data rates which are n/m (n and m are positive integers) of a predetermined basic channel rate;

a clock generation means for generating a first clock corresponding to the basic frequency of the basic channel rate of which the oscillation frequency is variable;

an n/m division means for n/m division of said first clock in accordance with the channel data rate of said reproduction means so as to output a second clock;

an A/D conversion means for converting an input signal inputted from said reproduction means to a digital signal with said second clock;

a phase error detection means for detecting a phase shift between the output of said A/D conversion means and said second clock based on the output of the A/D conversion means so as to output a phase error signal;

a first digital filter means for processing said phase error signal with said second clock;

a reproduction equalization means comprising a second digital filter means for processing the output of said A/D conversion means with said second clock; and a discrimination means for reproducing the originally recorded digital data from the output signal of said second digital filter means, wherein said multi-rate digital data reproducing device is characterized in that said clock generation means, said division means, said phase error detection means and said first digital filter means form a PLL means by controlling the oscillation frequency of said clock generation means with the output signal of said first digital filter means and that the originally recorded data are reproduced in accordance with a plurality of channel data rates which are reproduced by said second digital filter means.

3. A multi-rate digital data reproducing device for correcting a reproduction signal, of which the amplitude fluctuates, to a desired amplitude level, even when the channel data rate of the reproduction signal varies, comprising:

a reproduction means for reproducing recorded digital data at a plurality of channel data rates which are n/m (n and m are positive integers) of a predetermined basic channel rate;

a clock generation means for generating a first clock corresponding to the basic frequency of the basic channel rate of which the oscillation frequency is variable;

an n/m division means for n/m division of said first clock in accordance with the channel data rate of said reproduction means so as to output a second clock;

an A/D conversion means for converting an input signal inputted from said reproduction means to a digital signal with said second clock so as to gain a first reproduction signal;

a phase error detection means for detecting a phase shift between the output of said A/D conversion means and said second clock based on the output of said A/D conversion means so as to output a phase error signal;

a first digital filter means for processing said phase error signal with said second clock;

a multiplication means for gaining a second reproduction signal by multiplying said first reproduction signal outputted by said A/D conversion means by a first control signal;

an amplitude error detection means for detecting a difference between said second reproduction signal and a predetermined target level; and a second digital filter means for processing the output of said amplitude error detection means with said second clock so as to output said first control signal, wherein said clock generation means, said division means, said phase error detection means and said first digital filter means form a PLL means by controlling the oscillation frequency of said clock generation means with the output signal of said first digital filter means.

4. A multi-rate digital data reproducing device for detecting, from a reproduction signal of which a standard signal is multiplied to a predetermined frequency which, when a channel data rate varies, is 1/d of the channel data rate, said standard signal so as to detect the condition of the reproduced signal, comprising:

a reproduction means for reproducing recorded digital data at a plurality of channel data rates which are n/m (n and m are positive integers) of a predetermined basic channel rate;

a clock generation means for generating a first clock corresponding to the basic frequency of the basic channel rate of which the oscillation frequency is variable;

an n/m division means for n/m division of said first clock in accordance with the channel data rate of said reproduction means so as to output a second clock;

an A/D conversion means for converting an input signal inputted from said reproduction means to a digital signal with said second clock so as to gain a first reproduction signal;

a phase error detection means for detecting a phase shift between the output of said A/D conversion means and said second clock based on the output of said A/D conversion means so as to output a phase error signal;

a first digital filter means for processing said phase error signal with said second clock;

a second digital filter means for passing a predetermined frequency which is 1/d of the channel data rate by processing said first reproduction signal outputted by said A/D conversion means with said second clock; and a reproduction condition detection means for detecting the reproduction condition of said first reproduction signal by detecting the signal level which passes through said second digital filter means, wherein said clock generation means, said division means, said phase error detection means and said first digital filter means form a PLL means by controlling the oscillation frequency of said clock generation means with the output signal of said first digital filter means.

* * * * *